(12) United States Patent
Huang et al.

(10) Patent No.: US 11,387,361 B2
(45) Date of Patent: Jul. 12, 2022

(54) SEMICONDUCTOR STRUCTURE AND METHOD FOR FORMING THE SAME

(71) Applicant: Vanguard International Semiconductor Corporation, Hsinchu (TW)

(72) Inventors: Chin-Hsiu Huang, Tainan (TW); Tse-Hsiao Liu, Hsinchu (TW); Pao-Hao Chiu, Kaohsiung (TW); Chih-Cherng Liao, Jhudong Township (TW); Ching-Yi Hsu, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 183 days.

(21) Appl. No.: 16/783,419

(22) Filed: Feb. 6, 2020

(65) Prior Publication Data
US 2021/0249536 A1    Aug. 12, 2021

(51) Int. Cl.
| | |
|---|---|
| *H01L 29/51* | (2006.01) |
| *H01L 29/78* | (2006.01) |
| *H01L 29/165* | (2006.01) |
| *H01L 21/311* | (2006.01) |
| *H01L 29/66* | (2006.01) |

(52) U.S. Cl.
CPC .... *H01L 29/7848* (2013.01); *H01L 21/31144* (2013.01); *H01L 29/165* (2013.01); *H01L 29/518* (2013.01); *H01L 29/6656* (2013.01)

(58) Field of Classification Search
CPC .................................................. H01L 29/6656
See application file for complete search history.

(56) References Cited

U.S. PATENT DOCUMENTS

| | | | |
|---|---|---|---|
| 6,316,304 B1 * | 11/2001 | Pradeep | H01L 21/8238 438/303 |
| 2007/0238237 A1 | 10/2007 | Lee et al. | |
| 2008/0054356 A1 * | 3/2008 | Yoshida | H01L 29/6656 257/344 |
| 2013/0023101 A1 | 1/2013 | Chan et al. | |

(Continued)

OTHER PUBLICATIONS

Taiwanese Office Action and Search Report for Taiwanese Application No. 108142073, dated Jul. 15, 2020.

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

A method for forming a semiconductor structure includes: forming a first gate structure in a predetermined low-potential region of a substrate and a second gate structure in a predetermined high-potential region of the substrate; sequentially forming a first dielectric layer and a second dielectric layer covering the first gate structure and the second gate structure; forming a portion of a third dielectric layer along sidewalls of the second gate structure and on the second dielectric layer; and etching the first dielectric layer and the second dielectric layer with the portion of the third dielectric layer as an etching hard mask to form a first composite spacer covering sidewalls of the first gate structure, and a second composite spacer covering the sidewalls of the second gate structure, wherein a width of the first composite spacer is less than a width of the second composite spacer.

19 Claims, 7 Drawing Sheets

(56) References Cited

U.S. PATENT DOCUMENTS

2015/0031178 A1    1/2015  Riley et al.
2015/0228742 A1*  8/2015  Kim ................ H01L 21/823468
                                                      257/344
2019/0157421 A1*  5/2019  Wang ................ H01L 21/31111

* cited by examiner

SEMICONDUCTOR STRUCTURE AND METHOD FOR FORMING THE SAME

BACKGROUND

Technical Field

The disclosure relates to a semiconductor structure, and in particular, to a semiconductor structure with integrated high-voltage devices (HV devices) and low-voltage devices (LV devices), and a method thereof.

Description of the Related Art

As the semiconductor industry develops rapidly, higher performance, higher density, lower cost and becoming thinner and lighter have been the goals pursued during the design and fabrication of electronic products. For the current semiconductor industry, the above goals may be achieved by disposing devices with multiple functions onto one chip.

The integration of HV devices and LV devices onto one chip, such as a system on chip (SOC), may be an approach to achieving the above goals. However, to avoid the risk of gate structures subjected to high electric fields, the width of gate spacers in HV devices generally needs to be greater than that of gate spacers in LV devices. As such, the integrated process of HV devices and LV devices will face a variety of challenges.

While existing integrated fabrication methods and structures generally meet the requirements, they are not satisfactory in all respects. There is still a particular need for further improvements in enhancing the compatibility between HV devices and LV device and concomitantly reducing the cost of the fabrication process.

BRIEF SUMMARY OF THE DISCLOSURE

A method for forming a semiconductor structure is provided according to sonic embodiments of the disclosure. The method includes: providing a substrate which includes a predetermined low-potential region and a predetermined high-potential region; forming a first gate structure in the predetermined low-potential region and on the substrate; forming a second gate structure in the predetermined high-potential region and on the substrate; sequentially forming a first dielectric layer and a second dielectric layer on the substrate covering the first gate structure and the second gate structure, a material of the second dielectric layer different from a material of the first dielectric layer; forming a portion of a third dielectric layer along sidewalls of the second gate structure and on the second dielectric layer, a material of the third dielectric layer different from the material of the second dielectric layer; and etching the first dielectric layer and the second dielectric layer with the portion of the third dielectric layer as an etching hard mask to form a first composite spacer covering sidewalls of the first gate structure, and a second composite spacer covering the sidewall of the second gate structure, wherein the first composite spacer is formed of a portion of the first dielectric layer and a portion of the second dielectric layer, and the second composite spacer is formed of another portion of the first dielectric layer, another portion of the second dielectric layer and the portion of the third dielectric layer, a width of the first composite spacer less than a width of the second composite spacer.

A semiconductor structure is provided according to some embodiments of the disclosure. The semiconductor structure includes: a substrate which includes a low-potential region and a high-potential region; a first gate structure in the low-potential and on the substrate; a second gate structure in the high-potential and on the substrate; a first composite spacer covering sidewalls of the first gate structure, which includes a portion of a first dielectric layer and a portion of a second dielectric layer; and a second composite spacer covering sidewalk of the second gate structure, which includes another portion of the first dielectric layer, another portion of the second dielectric layer and a third dielectric layer, a width of the first composite spacer less than a width of the second composite dielectric layer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF THE DISCLOSURE

Figure 1:
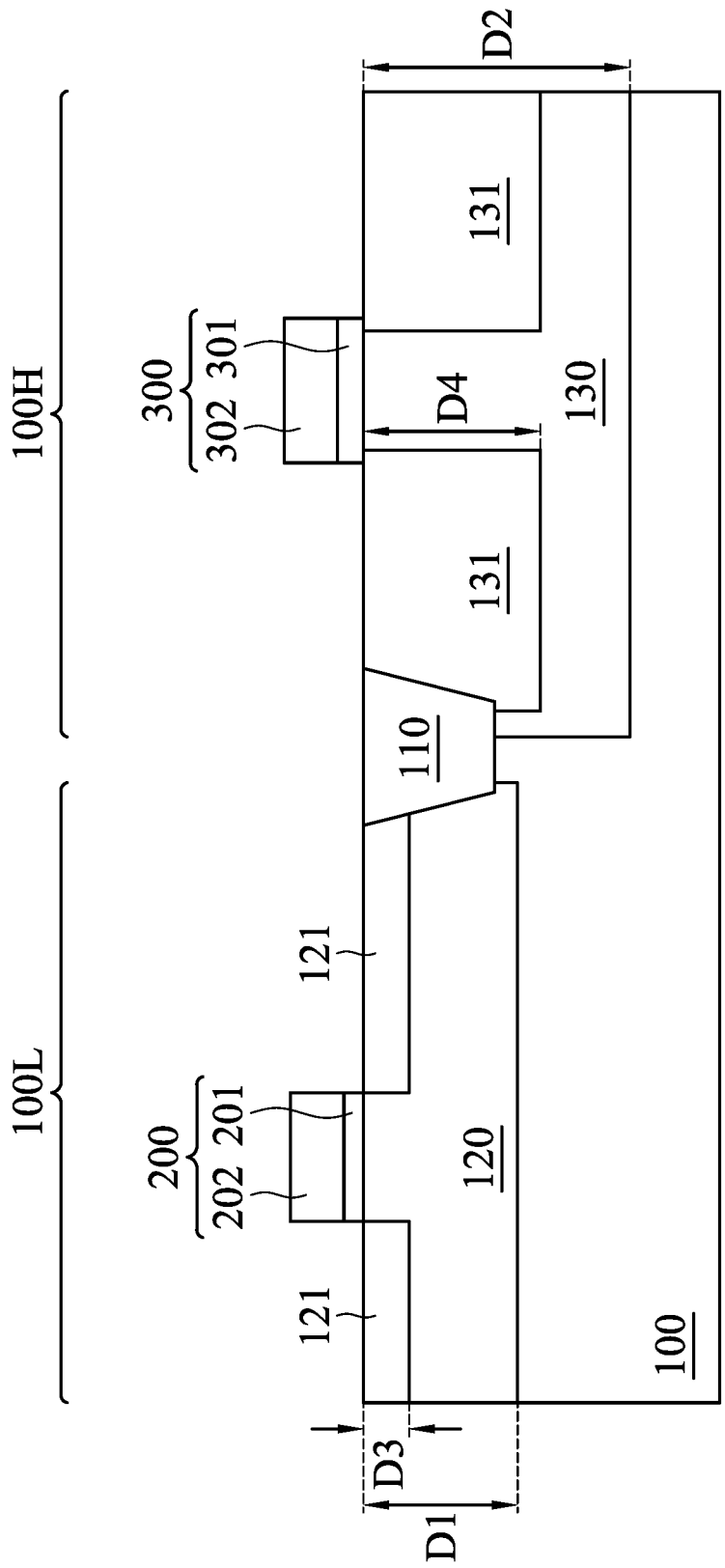
FIG. 1 is a cross-sectional view of various stages in the formation of a semiconductor structure in accordance with some embodiments of the disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

It should be understood that additional operation steps may be implemented before, between, or after the methods described in which portions of operation steps may be replaced or eliminated.

Furthermore, spatially relative terms, such as "beneath", "below", "lower", "over", "upper" and the like, may be used herein for ease of description to describe one element or feature's relationship to another element(s) or features) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately" and "substantially" typically mean+/−20% of the stated value, more typically +/−10% of the stated value and even more typically +/−5% of the stated value, more typically +/−3% of the stated value, more typically +/−2% of the stated value, more typically +/−1% of the stated value and even more typically +/−0.5% of the stated value. The stated value of the disclosure is an approximate value. When there is no specific description, the stated value includes the meaning of "about", "approximately" or "substantially"

Although some embodiments are discussed with operations performed in a particular order, these operations may be performed in another logical order. Additional features can be provided to the semiconductor structures in embodiments of the present disclosure. Some of the features described below can be replaced or eliminated for different embodiments.

The disclosure provides embodiments of a semiconductor structure formed by an anisotropic etching back process using dielectric materials with different etching selectivity, such that composite spacers with different widths are formed on sidewalk of the gate structure in the low-potential region and on sidewalls of the gate structure in the high-potential region during a single fabrication process. The composite spacer in the high-potential region has a greater width and is primarily formed of a stack of tri-layer dielectric materials (oxide-nitride-oxide), and the composite spacer in the low-potential region has a smaller width and is primarily formed of a stack of bi-layer dielectric materials (oxide-nitride). The semiconductor structure provided in the embodiments of the disclosure may respectively form required widths of gate spacers in a single fabrication process based on the product properties of HV devices and LC devices.

Figure 5:
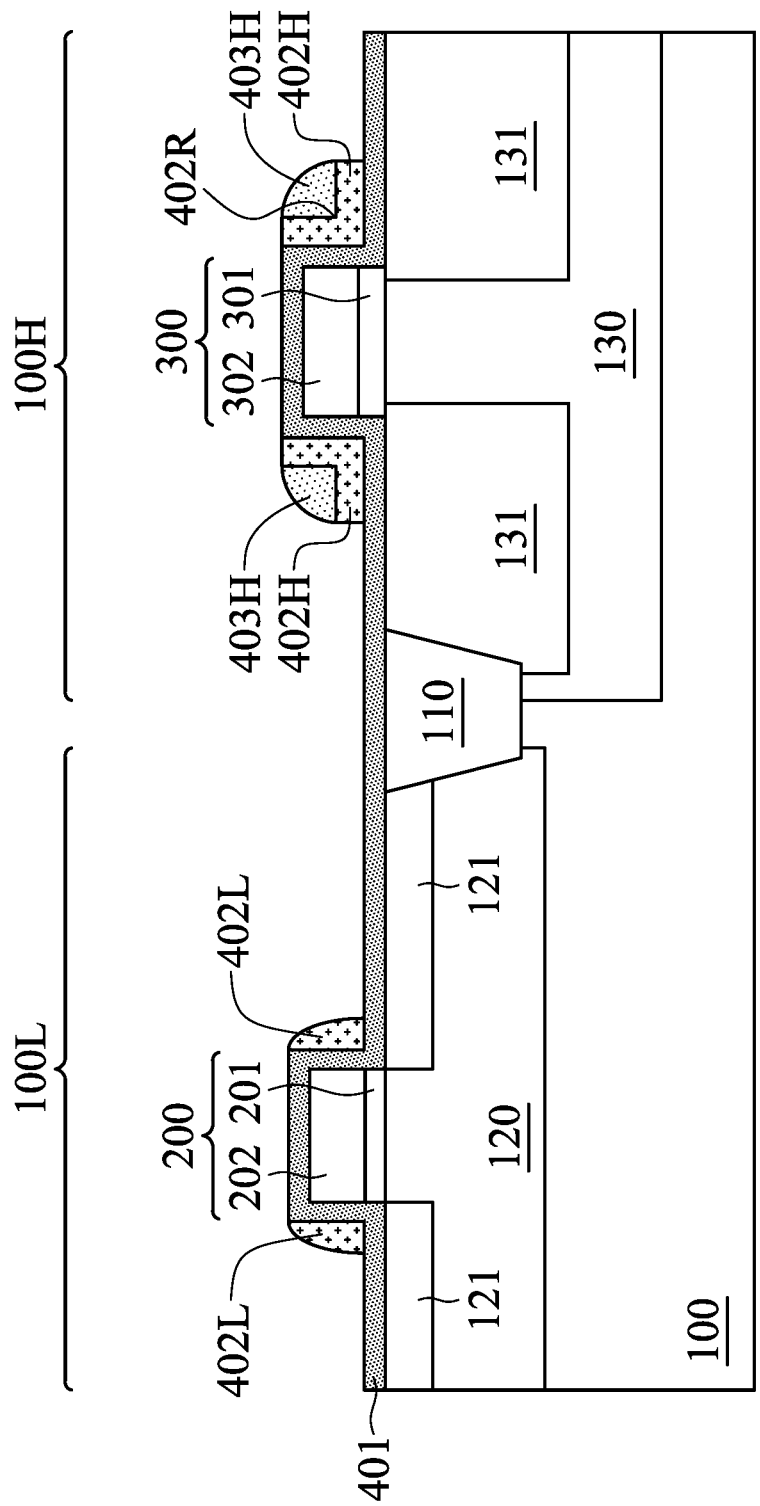
FIG. 5 is a cross-sectional view of various stages in the formation of a semiconductor structure in accordance with some embodiments of the disclosure.
Figure 6:
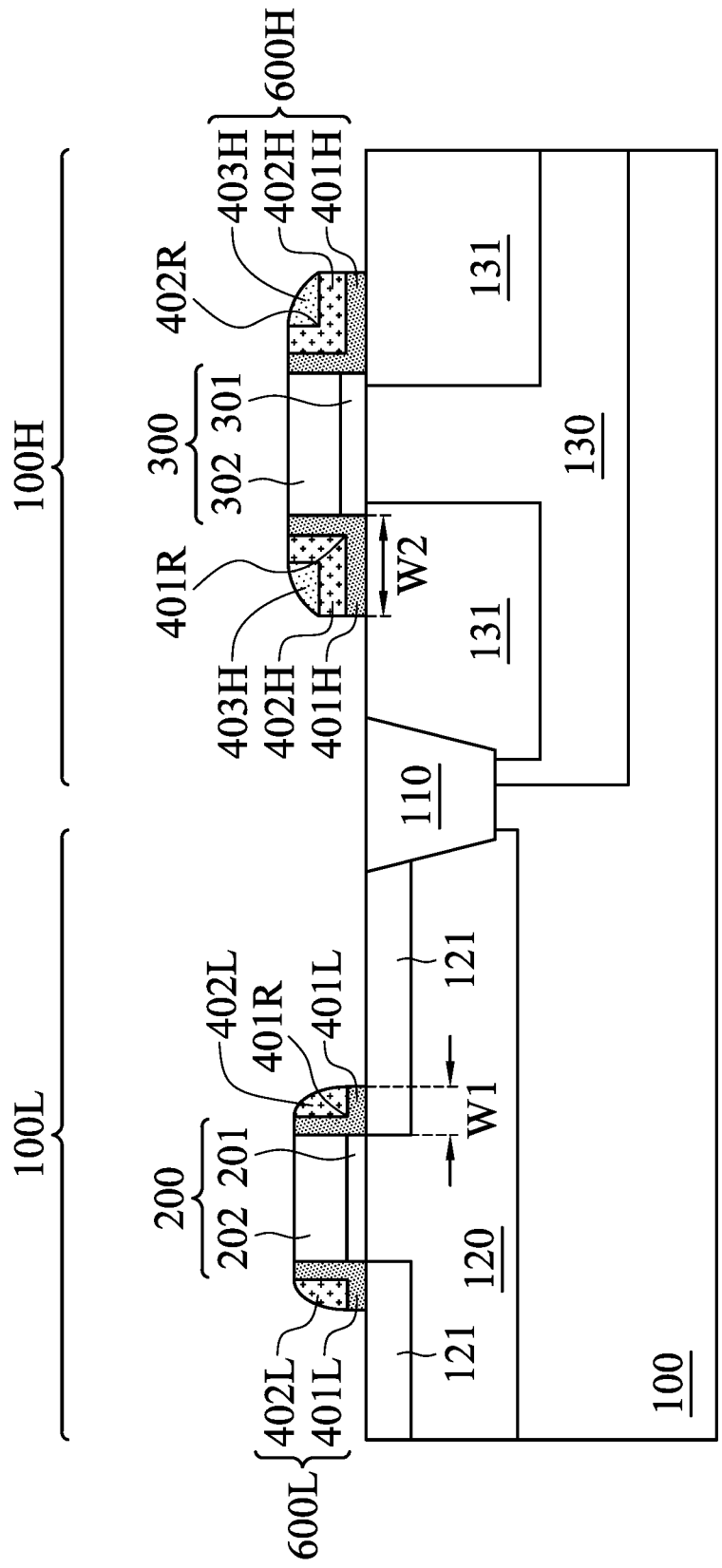
FIG. 6 is a cross-sectional view of various stages in the formation of a semiconductor structure in accordance with some embodiments of the disclosure.
Figure 7:
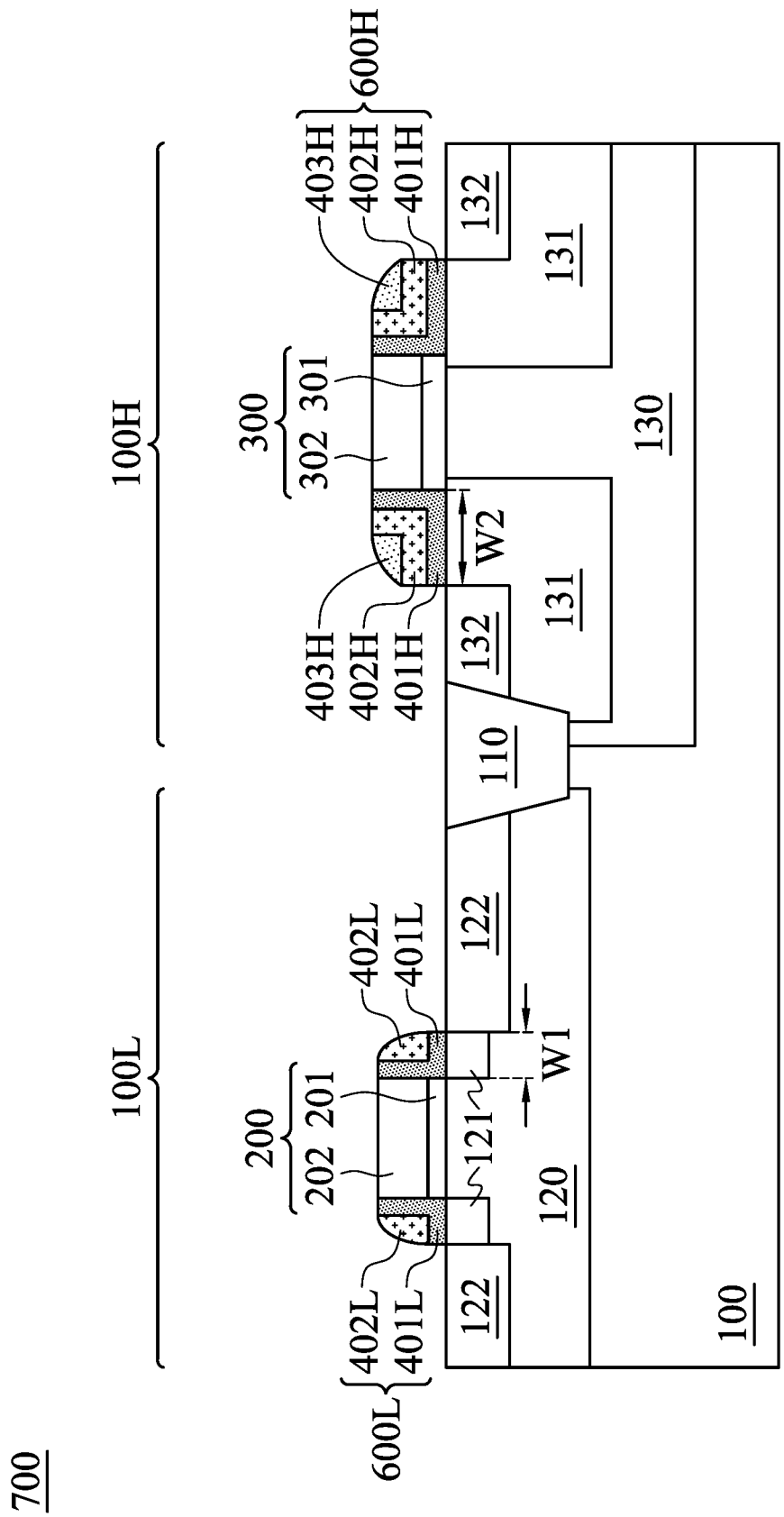
FIG. 7 is a cross-sectional view of a semiconductor structure in accordance with some embodiments of the disclosure.

FIGS. 1, 2, 3 4, 5 and 6 are cross-sectional views of various stages in the formation of the semiconductor structure 700 illustrated in FIG. 7 in accordance with some embodiments of the disclosure. Referring to FIG. 1, a substrate 100 is provided having a predetermined low-potential region 100L (which will subsequently become a low-potential region) and a predetermined high-potential region 100H (which will subsequently become a high-potential region). A first gate structure 200 and a second gate structure 300 are formed on the substrate 100 within the predetermined low-potential region 100L and the predetermined high-potential region 100H, respectively. As shown in FIG. 1, the substrate 100 includes a first well region 120 in the predetermined low-potential region 100L, a second well region 130 in the predetermined high-potential region 100H, and an isolation structure 110 between the predetermined low-potential region 100L and the predetermined high-potential region 100H.

In some embodiments, the substrate 100 may be a semiconductor substrate, such as a silicon substrate. In other embodiments, the semiconductor substrate may also be an elemental semiconductor including germanium; a compound semiconductor including gallium nitride, silicon carbide, gallium arsenide, gallium phosphide, indium phosphide, indium arsenide and/or indium antimonide; and an alloy semiconductor including SiGe, GaAsP, AlGaAs, GaInAs, GaInP, GaInAsP and/or a combination thereof. In other embodiments, the substrate 100 may also be a semiconductor-on-insulator substrate which may include a substrate, a buried oxide layer disposed on the substrate and a semiconductor layer disposed on the buried oxide layer. In addition, according to some embodiments of the disclosure, the substrate 100 may be a first conductive type, such as p-type, with the dopant such as B, Al, Ga, In, $BF^{3+}$ ions, or a combination thereof. The dopant concentration is in a range between about $10^{14}$ atoms/cm$^3$ and about $10^{18}$ atoms/cm$^3$.

In some embodiments, the isolation structure 110, which is included in the substrate 100, between the predetermined low-potential region 100L and the predetermined high-potential region 100H may be used to define a chip region (not shown) and electrically isolate the semiconductor devices respectively in the predetermined low-potential region 100L and the predetermined high-potential region 100H. In some embodiments, the isolation structure 100 may include a shallow trench isolation (STI) structure, a local oxidation of silicon (LOCOS) structure, other suitable isolation features or a combination thereof. The material of the isolation structure 100 may include silicon dioxide, nitrogen-doped silicon oxide, silicon nitride, silicon oxynitride or the like.

Referring still to FIG. 1, in some embodiments, the first well region 120 in the predetermined low-potential region 100L and the second well region 130 in predetermined high-potential region 100H may be formed by an implantation process or a diffusion process. In some embodiments, the first well region 120 and the second well region 130 may respectively have a second conductive type different from the first conductive type, such as n-type, with the dopant such as P, As, N, Sb ions, or a combination thereof. The dopant concentration of the first well region 120 is in a range between about $10^{17}$ atoms/cm$^3$ and about $10^{22}$ atoms/cm$^3$, and the dopant concentration of the second well region 130 is in a range between about $10^{15}$ atoms/cm$^3$ and about $10^{20}$ atoms/cm$^3$.

Referring still to FIG. 1, the first gate structure 200 on the first well region 120 of the predetermined low-potential region 100L includes a first gate dielectric layer 201 and a first gate electrode 202 formed on the first gate dielectric layer 201. In some embodiments, the material of the first gate dielectric layer 201 may include silicon oxide, silicon nitride, silicon oxynitride, a high-k dielectric material, a combination thereof or other suitable dielectric materials. In some embodiments, the first gate dielectric layer 201 may be formed by thermal oxidation, chemical vapor deposition (CVD) or atomic layer deposition. The material of the first gate electrode 202 may include metal silicide, amorphous silicon, polysilicon, one or more kinds of metals, metal nitrides, conductive metal oxides, a combination thereof, or other suitable conductive materials. The conductive material layer may be formed by chemical vapor deposition (CVD), sputtering, a resistive thermal evaporation process, an electron beam evaporation process, or other suitable deposition processes.

On the other hand, as shown in FIG. 1, the second gate structure 300 on the second well region 130 of the predetermined high-potential region 100H includes a second gate dielectric layer 301 and a second gate electrode 302 formed on the second gate dielectric layer 301. In some embodiments, the materials and the methods used to form the second gate dielectric layer 301 and the second gate electrode 302 may be selected from the materials and the methods used to form the first gate dielectric layer 201 and the first gate electrode 202, which is not repeated herein. In addition, the width of the second gate dielectric layer 301 formed in the predetermined high-potential region 1001-I may be greater than the width of the first gate dielectric layer 201 so as to withstand higher breakdown voltage.

Referring still to FIG. 1, according to some embodiments of the disclosure, after forming the first gate structure 200, an implantation process is performed to form a pair of first lightly-doped region 121 in the predetermined low-potential region 100L and on opposite sides of the first gate structure 200, and a pair of second lightly-doped region 131 in the predetermined high-potential region 100H and on opposite sides of the second gate structure 300. In some embodiments, the first lightly-doped region 121 and the second lightly-doped region 131 may respectively have the second conductive type different from the first conductive type, such as n-type, with the dopant such as P, As, N, Sb ions, or a combination thereof. The dopant concentration of the first lightly-doped region 121 is in a range between about $10^{17}$ atoms/cm$^3$ and about $10^{22}$ atoms/cm$^3$. On the other hand, the dopant concentration of the second lightly-doped region 131 is in a range between about $10^{15}$ atoms/cm$^3$ and about $10^{20}$ atoms/cm$^3$. The depth D4 of the second lightly-doped region 131 is greater than the depth D3 of the first lightly-doped region 121. In other embodiments, the first lightly-doped region 121 and the second lightly-doped region 131 may also have different conductive types. For example, the first lightly-doped region 121 has the second conductive type while the second lightly-doped region 131 has the first conductive type. It should be noted that, since the conductive types set forth above are used merely for the purpose of illustration, which may be adjusted based on the product design, the disclosure is not limited thereto.

According to some embodiments of the disclosure, the hot-carrier effect (HCE) due to acceleration of carriers between the gate structures (e.g. the first gate structure 200 and the second gate structure 300) and the source/drain region (e.g. the first and the second source/drain region 122-132 in FIG. 7) subsequently formed on opposite sides of the gate structures by a high electric field may be effectively reduced by forming the first lightly-doped region 121 in the predetermined low-potential region 100L and the second lightly-doped region 131 in the predetermined high-potential region 100H.

Figure 2:
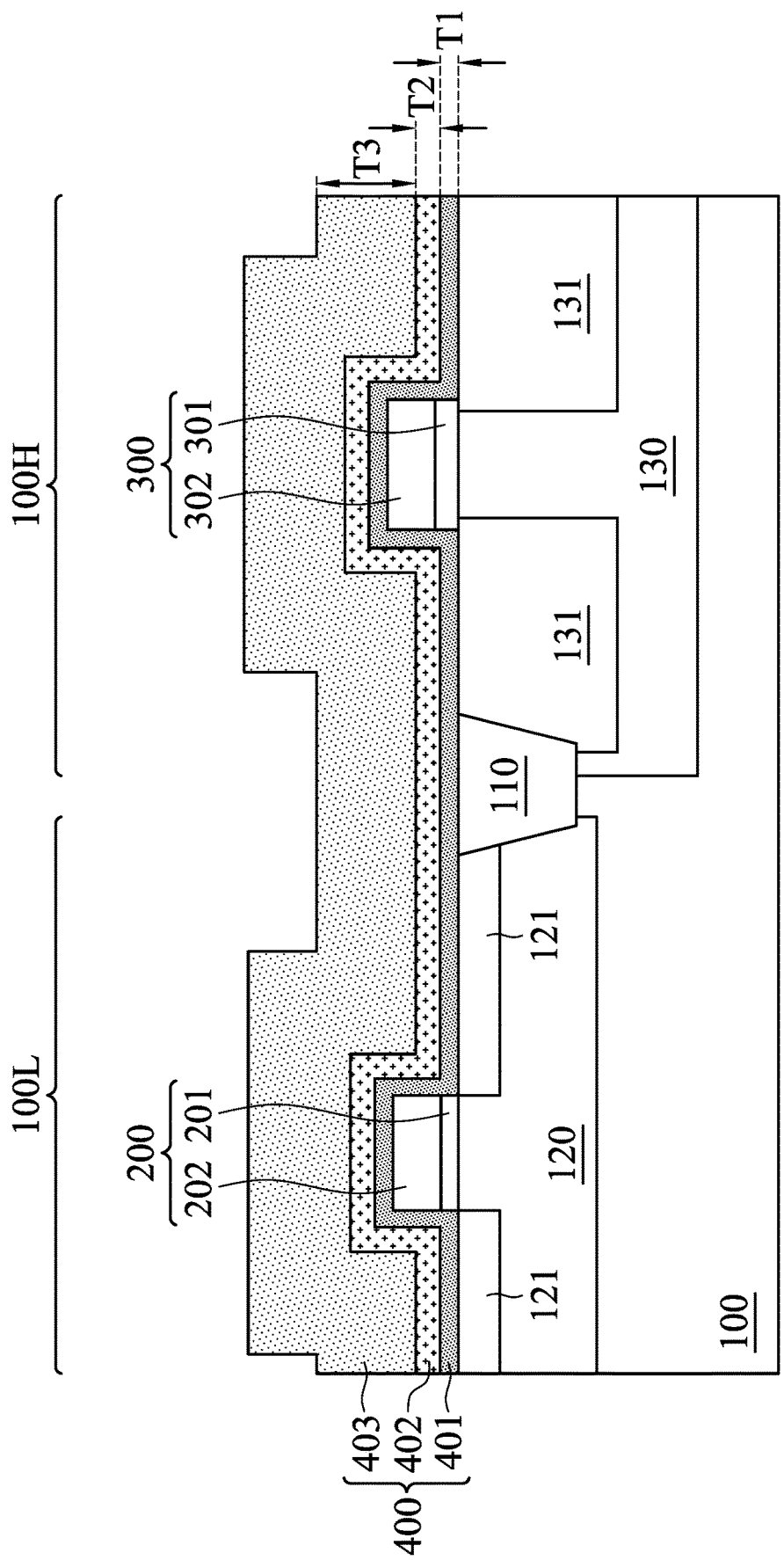
FIG. 2 is a cross-sectional view of various stages in the formation of a semiconductor structure in accordance with some embodiments of the disclosure.

FIG. 2 is a cross-sectional view illustrating the formation of a stack of dielectric layers 400 on the substrate 100 covering the first gate structure 200 and the second gate structure 300 in accordance with some embodiment is of the disclosure.

Referring to FIG. 2, the stack of dielectric layers 400 includes a first dielectric layer 401, a second dielectric layer 402 and a third dielectric layer 403 sequentially formed on the substrate 100. The material of the second dielectric layer 402 is different from the material of the first dielectric layer 401, and the material of the third dielectric layer 403 is different from the material of the second dielectric layer 402. According o some embodiments of the disclosure, the first dielectric layer 401 and the third dielectric layer 403 may respectively include an oxide material, and the second dielectric layer 402 may include a nitride material. In some embodiments, the first dielectric layer 401 and the third dielectric layer 403 may include the same oxide material or different oxide materials.

For example, the first dielectric layer 401, the second dielectric layer 402 and the third dielectric layer 403 may include silicon oxide, silicon nitride, silicon oxynitride, tetraethoxysilane (TEOS), phosphosilicate glass (PSG), borophosphosilicate glass (BPSG), a low-k dielectric material and/or other suitable dielectric materials. The low-k dielectric material may include, but not limit to, fluorinated silicate glass (FSG), hydrogen silsesquioxane (HSQ), carbon-doped silicon oxide, amorphous fluorinated carbon, parylene, bis-benzocyclobutenes (BCB) or polyimide. In some embodiments, the dielectric materials may be deposited on the substrate 100 by spin coating, chemical vapor deposition (CVD), physical vapor deposition (PVD), atomic layer deposition (ALD), high density plasma CVD (HDPCVD), other suitable methods or a combination thereof to sequentially form the first dielectric layer 401, the second dielectric layer 402 and the third dielectric layer 403.

According to some embodiments of the disclosure, the thickness of the resulting first dielectric layer 401 is in a range between about 1 nm and about 200 nm, such as about 30 nm. The thickness of the second dielectric layer 402 is in a range between about 10 nm and about 400 nm, such as about 50 nm. The thickness of the third dielectric layer 403 is in a range between about 20 nm and about 600 nm, such as about 60 nm. In some embodiments, the thicknesses of the first dielectric layer 401, the second dielectric layer 402 and the third dielectric layer 403 are in the ratio of 3:5:6. Composite spacers with different widths in the low-potential region and the high-potential region may be respectively formed in a single fabrication process by a subsequent anisotropic etching back process using the stack of dielectric layers 400 which includes dielectric layers with different etching selectivity and widths. In particular, the widths of the gate spacers required for the LV device in the predetermined low-potential region 100L and the HV device in the predetermined high-potential region 100H may be respectively formed by adjusting the widths of the second dielectric layer 402 and the third dielectric layer 403 subsequently used as an etching hard mask.

Figure 3:
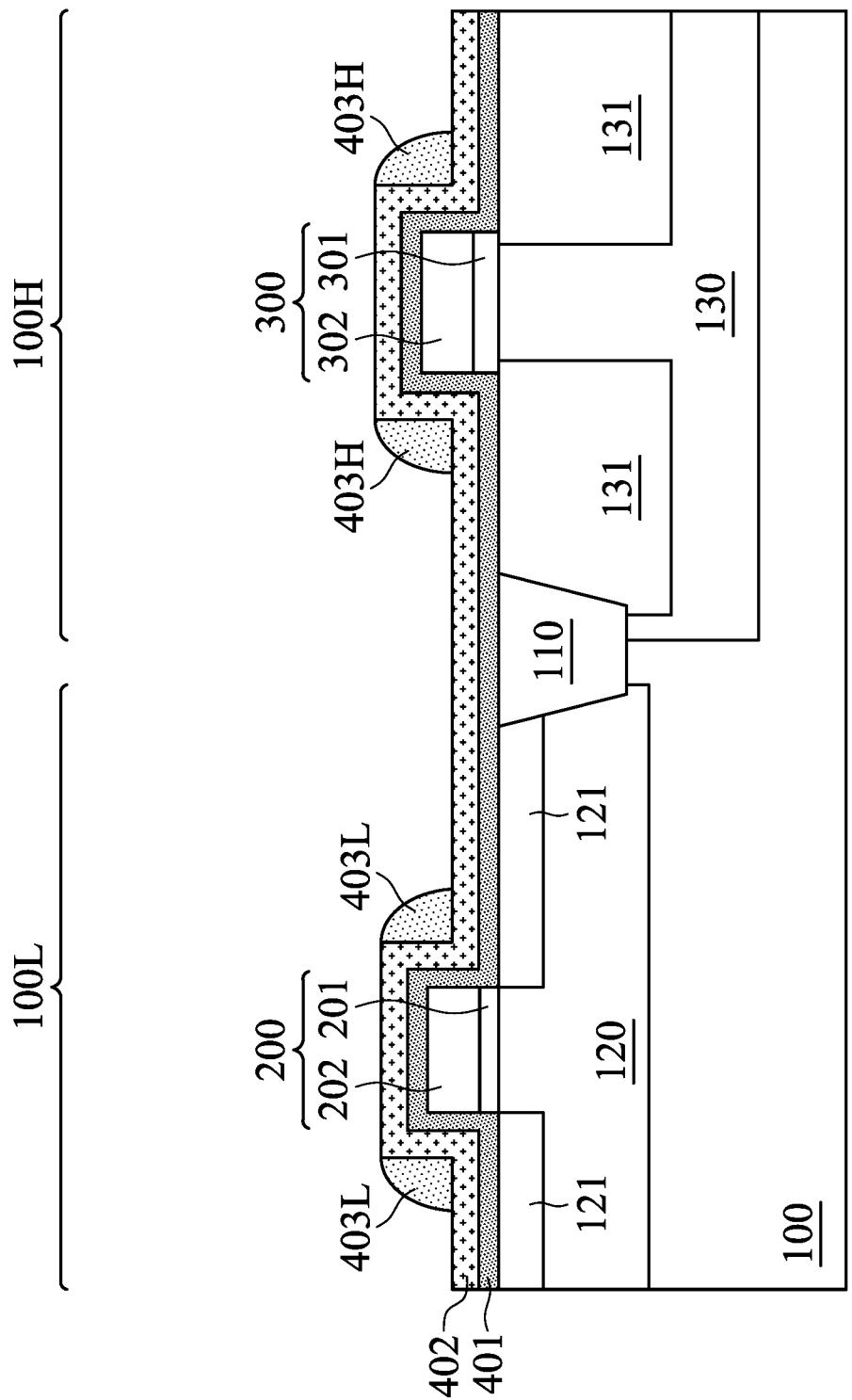
FIG. 3 is a cross-sectional view of various stages in the formation of a semiconductor structure in accordance with some embodiments of the disclosure.

FIG. 3 is a cross-sectional view illustrating a third dielectric layer portion 403L and a third dielectric layer portion 403H respectively formed in the predetermined low-potential region 100L and the predetermined high-potential region 100H in accordance with some embodiments of the disclosure. In particular, after the step of forming the third dielectric layer 403 to cover the second dielectric layer 402, the third dielectric layer 403 is etched to form the third dielectric layer portion 403L along sidewalls of the first gate structure 200, and the third dielectric layer portion 403H along sidewalls of the second gate structure 300. In some embodiments, the etching step may be performed using an anisotropic etching back process. In some embodiments, the anisotropic etching back process may include dry etching, such as reactive ion etching (RIE), neutral beam etching (NBE), inductively coupled plasma (ICP) etching, the like or a combination thereof. In some embodiments, an etching chemical used for the dry etching may include fluorocarbon-based chemicals (e.g. fluorinated hydrocarbon), such as tetrafluoromethane (CFA trifluoromethane (CHF$_3$) or the like.

Figure 4:
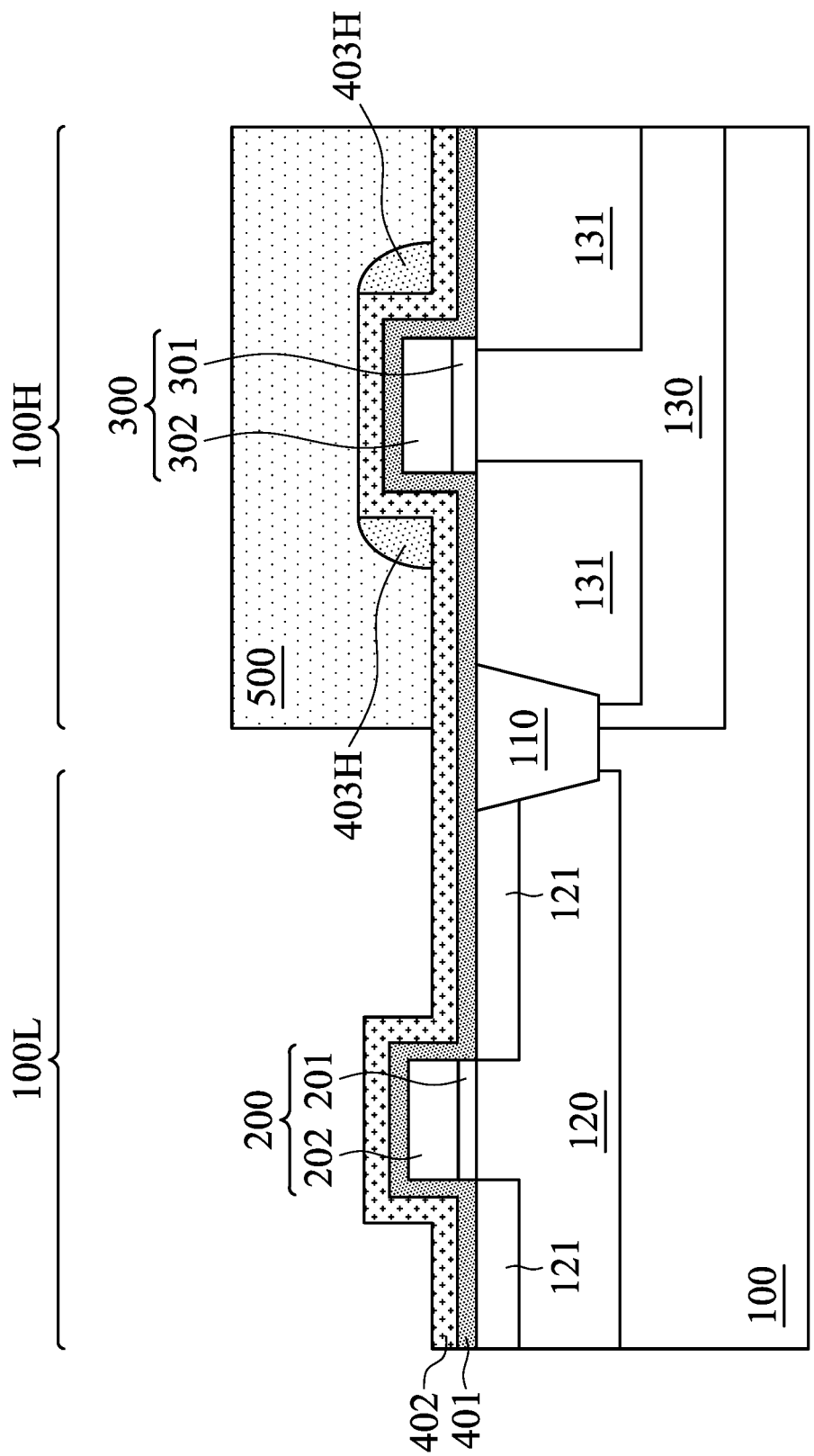
FIG. 4 is a cross-sectional view of various stages in the formation of a semiconductor structure in accordance with some embodiments of the disclosure.

Next, FIG. 4 is a cross-sectional view illustrating the third dielectric layer portion 403H in the predetermined high-potential region 100H remaining along the sidewalls of the second gate structure 300 in accordance with some embodiments of the disclosure. As shown in FIG. 4, after the step of respectively forming the third dielectric layer portion 403L and the third dielectric layer portion 403H by an etching process, a mask layer 500 is formed in the predetermined high-potential region 100H. The third dielectric layer portion 403H remains in the predetermined high-potential region 100H by etching the third dielectric layer 403 with the mask layer 500 shielding the predetermined high-potential region 100H. The third dielectric layer portion 403L in the predetermined low-potential region 100L is removed. In some embodiments, the etching process may be an anisotropic etching back process.

In some embodiments, the mask layer 500 may be formed by a spin-on coating process to coat a photoresist, and exposing the photoresist with a suitable reticle to form a patterned photoresist (referred to as the mask layer 500) shielding the predetermined high-potential region 100H. After forming the mask layer 500, an etching process is performed to remove the third dielectric layer portion 403L in the predetermined low-potential region 100L. According to some embodiments of the disclosure, the etching process may be a wet etching process, a dry etching process, other suitable etching processes or a combination thereof. In some embodiments, an etching chemical used for the wet etching process may include a hydrofluoric acid (HF) diluted solution with, for example, ammonium fluoride ($NH_4F$), $HF/H_2O$, $H_3PO_4$, $H_2SO_4/H_2O$ or a combination thereof as a buffer agent. The etching method and the etching chemical used for the dry etching process may be selected from the method and the etching chemical of the dry etching process with reference to FIG. 3 above, which is not repeated herein. Next, the mask layer 500 may be removed by ashing or wet stripping.

FIG. 5 is a cross-sectional view illustrating an anisotropic etching back process performed to the second dielectric layer 402 with the third dielectric layer portion 403H, which remains in the predetermined high-potential region 100H, to serve as an etching hard mask. In particular, as shown in FIG. 5, a second dielectric layer portion 402L along the sidewalls of the first gate structure 200 in the predetermined low-potential region 100L and a second dielectric layer portion 402H along the sidewalls of the second gate structure 300 in the predetermined high-potential region 100H are formed. According to some embodiments of the disclosure, the etching method and the etching chemical used for the anisotropic etching back process may be selected from the method and the etching chemical of the dry etching process with reference to FIG. 3 above, which is not repeated herein.

Referring still to FIG. 5, the second dielectric layer portion 402H along the sidewalk of the second gate structure 300 is formed as an L shape, and the third dielectric layer portion 403H, as an etching hard mask, is in a rabbet 402R of the L shape. Since the third dielectric layer portion 403H, as an etching hard mask, is partially consumed during the anisotropic etching back process for the second dielectric layer 402, the third dielectric layer portion 403H illustrated in FIG. 5 is slightly smaller than the third dielectric layer portion 403H in FIG. 4.

Next, FIG. 6 is a cross-sectional view illustrating the formation of a first composite spacer 600L covering the sidewalls of the first gate structure 200, and a second composite spacer 600H covering the sidewalls of the second gate structure 300 in accordance with some embodiments of the disclosure. As shown in FIG. 6, an etching process is performed to the first dielectric layer 401 with the second dielectric layer portion 402L in the predetermined low-potential region 100L and the second dielectric layer portion 402H in the predetermined high-potential region 100H as etching hard masks, respectively, to form a first dielectric layer portion 401L covering the sidewalls of the first gate structure 200 and a first dielectric layer portion 401H covering the sidewalls of the second gate structure 300. in some embodiments, the etching process may be an anisotropic etching back process. The resulting first dielectric layer portion 401L and the first dielectric layer portion 401H are both of an L shape, and the second dielectric layer portion 402L and the second dielectric layer portion 402H, as etching hard masks, are respectively formed in a rabbet 401R. of the L shape of the first dielectric layer portion 401L and the first dielectric layer portion 401H. In some embodiments, the etching method and the etching chemical used for the anisotropic etching back process may be selected from the method and the etching chemical of the dry etching process with reference to FIG. 3 above, which is not repeated herein.

Referring still to FIG. 6, according to some embodiments of the disclosure, the first dielectric layer portion 401L and the second dielectric layer portion 402L of the L shape form the first composite spacer 600L covering the sidewalls of the first gate structure 200, and the first dielectric layer portion 401H, the second dielectric layer portion 402H and the third dielectric layer portion 403H of the L shape form the second composite spacer 600H covering the sidewalls of the second gate structure 300. In some embodiments, the width W1 of the first composite spacer 600L may be in a range of between about 1 nm and about 600 nm, and the width W2 of the second composite spacer 600H is greater than the width W1 of the first composite spacer 600L. For example, the width W2 of the second composite spacer 600H may be in a range of between about 30 nm and about 700 nm. According to some embodiments of the disclosure, the width W1 of the first composite spacer 600L may be adjusted by adjusting the thickness 12 of the second dielectric layer 402 illustrated in FIG. 2 while the width W2 of the second composite spacer 600H may be adjusted by adjusting the thickness 13 of the third dielectric layer 403. The width W1 and the thickness T2 are both in a positive correlation with the width W2 and the thickness T3.

Next, FIG. 7 is a cross-sectional view illustrating the formation of a pair of first source/drain regions 122 in the predetermined low-potential region 100L and on opposite sides of the first gate structure 200, and a pair of second source/drain regions 132 in the predetermined high-potential region 100H and on opposite sides of the second gate structure 300 in accordance with some embodiments of the disclosure. As shown in FIG. 7, after the step of forming the first composite spacer 600L and the second composite spacer 600H, an ion implantation process may be performed to respectively implant adequate dopants into the substrate 100, and respectively form the first source/drain region 122 and the second source/drain region 132 close to a top surface of the substrate 100. The dopant concentration of the first source/drain region 122 may be in a range between, for example, about $1\times10^{18}$ atoms/$cm^3$ and about $1\times10^{23}$ atoms/$cm^3$, which is greater than the dopant concentration of the first lightly-doped region 121. The dopant concentration of the second source/drain region 132 may be in a range between, for example, about $1\times10^{18}$ atoms/$cm^3$ and about $1\times10^{23}$ atoms/$cm^3$, which is greater than the dopant concentration of the second lightly-doped region 131. In some embodiments, the first source/drain region 122 has the same conductive type as the first slightly-doped region 121, and the second source/drain region 132 has the same conductive type as the second lightly-doped region 131.

As shown in FIG. 7, during the step of forming the first source/drain region 122 in the predetermined low-potential region 100L (or referred to as low-potential region) of the semiconductor structure 700, a distance between the first source/drain region 122 and the first gate structure 200 is essentially the width W1 of the first composite spacer 600L due to the shielding effect of the first composite spacer 600L during the ion implantation process. On the other hand, during the step of forming the second source/drain region 132 in the predetermined high-potential region 100H (or referred to as high-potential region) of the semiconductor structure 700, a distance between the second source/drain region 132 and the second gate structure 300 is essentially the width W2 of the second composite spacer 600H due to the shielding effect of the second composite spacer 600H during the ion implantation process. According to some embodiments of the disclosure, the semiconductor structure 700 concurrently includes a configuration of the first composite spacer 600L with a smaller width in the low-potential region 100L, and the second composite spacer 600H with a greater width in the high-potential region 100H, such that the utilization of the substrate 100 of the low-potential region 100L is enhanced. Furthermore, the electric field gradient surrounding the gate structures may be reduced and the risk of the second gate structure 300 subjected to high electric fields may be effectively avoided by an adequate distance between the second gate structure 300 in the high-potential region 100H and the second source/drain region 132 on opposite sides of the second gate structure 300.

The disclosure provides embodiments of a semiconductor structure formed by an anisotropic etching back process using dielectric materials with different etching selectivity, such that composite spacers with different widths are formed on sidewalls of the gate structure in the low-potential region (such as the first gate structure 200) and on sidewalls of the gate structure in the high-potential region (such as the second gate structure 300) in a single fabrication process. The width of the composite spacer in the high-potential region (such as the second composite spacer 600H) is greater than the width of the composite spacer in the low-potential region (such as the first composite spacer 600L). The composite spacer in the high-potential region (such as the second composite spacer 600H) is primarily formed of a stack of tri-layer dielectric materials (the first dielectric layer-the second dielectric layer-the third dielectric layer), and the composite spacer in the low-potential region (such as the first composite spacer 600L) primarily formed of a stack of bi-layer dielectric materials (the first dielectric layer-the second dielectric layer). The semiconductor structure provided in the embodiments of the disclosure may respectively form required widths of gate spacers in a single fabrication process based on product properties of I-IV devices and LC devices, and thus integrating HV devices and LC devices into the semiconductor structure without increasing additional process cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

providing a substrate which comprises a predetermined low-potential region and a predetermined high-potential region;

forming a first gate structure in the predetermined low-potential region and on the substrate;

forming a second gate structure in the predetermined high-potential region and on the substrate;

sequentially forming a first dielectric layer and a second dielectric layer on the substrate covering the first gate structure and the second gate structure, wherein a material of the second dielectric layer is different from a material of the first dielectric layer;

forming a portion of a third dielectric layer along sidewalls of the second gate structure and on the second dielectric layer, wherein a material of the third dielectric layer is different from the material of the second dielectric layer; and etching the first dielectric layer and the second dielectric layer with the portion of the third dielectric layer as an etching hard mask to form a first composite spacer covering sidewalls of the first gate structure, and a second composite spacer covering the sidewalls of the second gate structure, wherein the first composite spacer is formed of a portion of the first dielectric layer and a portion of the second dielectric layer, wherein the portion of the second dielectric layer has a tapered shape; the second composite spacer is formed of another portion of the first dielectric layer, another portion of the second dielectric layer and the portion of the third dielectric layer; and a width of the first composite spacer is less than a width of the second composite spacer.

2. The method of claim 1, wherein the first dielectric layer and the third dielectric layer respectively comprise an oxide material, and the second dielectric layer comprises a nitride material.

3. The method of claim 1, wherein the step of forming the portion of the third dielectric layer along the sidewalls of the second gate structure and on the second dielectric layer comprises:

forming the third dielectric layer covering the second dielectric layer; and etching the third dielectric layer to form the portion of the third dielectric layer along the sidewalls of the second gate structure, and another portion of the third dielectric layer along the sidewalls of the first gate structure.

4. The method of claim 3, wherein the step of forming the portion of the third dielectric layer along the sidewalls of the second gate structure and on the second dielectric layer further comprises:

forming a mask layer in the predetermined high-potential region; and etching the third dielectric layer with the mask layer shielding the predetermined high-potential region such that the portion of the third dielectric layer remains in the predetermined high-potential region and the another portion of the third dielectric layer in the predetermined low-potential region is removed.

5. The method of claim 3, wherein the portion of the first dielectric layer is of an L shape in a cross-sectional view of the predetermined low-potential region, and the portion of the second dielectric layer is formed in a rabbet of the L shape.

6. The method of claim 3, wherein both of the another portion of the first dielectric layer and the another portion of the second dielectric layer are of an L shape in a cross-sectional view of the predetermined high-potential region, wherein the another portion of the second dielectric layer is formed in a rabbet of the L shape of the another portion of the first dielectric layer, and the portion of the third dielectric layer is formed in a rabbet of the L shape of the another portion of the second dielectric layer.

7. The method of claim 1, wherein a thickness of the first dielectric layer is in a range between 1 nm and 200 nm, a thickness of the second dielectric layer is in a range between 10 nm and 400 nm, and a thickness of the third dielectric layer is in a range between 20 nm and 600 nm.

8. The method of claim 1, further comprising:
prior to the step of forming the first dielectric layer, performing an ion implantation process to form a pair of first lightly-doped regions in the predetermined low-potential region and on opposites side of the first gate structure, and to form a pair of second lightly-doped regions in the predetermined high-potential region and on opposite sides of the second gate structure.

9. The method of claim 1, wherein the step of forming the first gate structure in the predetermined low-potential region comprises:
forming a first gate dielectric layer on the substrate; and
forming a first gate electrode on the first gate dielectric layer, and wherein the step of forming the second gate structure in the predetermined high-potential region comprises:
forming a second gate dielectric layer on the substrate; and
forming a second gate electrode on the second gate dielectric layer, wherein a thickness of the second gate dielectric layer is greater than a thickness of the first gate dielectric layer.

10. The method of claim 1, further comprising:
after the step of forming the first composite spacer and the second composite spacer, forming a pair of first source/drain regions in the predetermined low-potential region and on opposite sides of the first gate structure, wherein the pair of first source/drain regions is located close to a top surface of the substrate; and
forming a pair of second source/drain regions in the predetermined high-potential region and on opposite sides of the second gate structure, wherein the pair of second source/drain regions is located close to the top surface of the substrate.

11. The method of claim 1, further comprising forming an isolation structure in the substrate and between the predetermined low-potential region and the predetermined high-potential region.

12. A semiconductor structure, comprising:
a substrate comprising a low-potential region and a high-potential region;
a first gate structure in the low-potential and on the substrate;
a second gate structure in the high-potential and on the substrate;
a first composite spacer covering sidewalls of the first gate structure and comprising a portion of a first dielectric layer and a portion of a second dielectric layer, wherein the portion of the second dielectric layer has a tapered shape; and
a second composite spacer covering sidewalls of the second gate structure and comprising another portion of the first dielectric layer, another portion of the second dielectric layer and a third dielectric layer, wherein a width of the first composite spacer is less than a width of the second composite dielectric layer, and
wherein the portion of the first dielectric layer is of an L shape in a cross-sectional view of the low-potential region, and the portion of the second dielectric layer is formed in a rabbet of the L shape.

13. The semiconductor structure of claim 12, wherein a material of the first dielectric layer is different from a material of the second dielectric layer, and the material of the second dielectric layer is different from a material of the third dielectric layer.

14. The semiconductor structure of claim 12, wherein the first dielectric layer and the third dielectric layer respectively comprise an oxide material, and the second dielectric layer comprises a nitride material.

15. The semiconductor structure of claim 12, wherein both of the another portion of the first dielectric layer and the another portion of the second dielectric layer are of an L shape in a cross-sectional view of the high-potential region, wherein the another portion of the second dielectric layer is in a rabbet of the L shape of the another portion of the first dielectric layer, and the third dielectric layer is in a rabbet of the L shape of the another portion of the second dielectric layer.

16. The semiconductor structure of claim 12, further comprising:
a pair of first lightly-doped regions in the low-potential region and on opposite sides of the first gate structure; and
a pair of second lightly-doped regions in the high-potential region and on opposite sides of the second gate structure.

17. The semiconductor structure of claim 12, wherein the first gate structure comprises:
a first gate dielectric layer on the substrate; and
a first gate electrode on the first gate dielectric layer; and wherein the second gate structure comprises:
a second gate dielectric layer on the substrate; and
a second gate electrode on the second gate dielectric layer, wherein a thickness of the second gate dielectric layer is greater than a thickness of the first gate dielectric layer.

18. The semiconductor structure of claim 12, further comprising:
a pair of first source/drain regions in the low-potential region and on opposite sides of the first gate structure, wherein the pair of first source/drain regions is located close to a top surface of the substrate; and
a pair of second source/drain regions in the high-potential region and on opposite sides of the second gate structure, wherein the pair of second source/drain regions is located close to the top surface of the substrate.

19. The semiconductor structure of claim 12, further comprising:
an isolation structure in the substrate and between the low-potential region and the high-potential region.

* * * * *